(12) United States Patent
Barreau et al.

(10) Patent No.: US 8,693,170 B2
(45) Date of Patent: Apr. 8, 2014

(54) CONTROL ASSEMBLY COMPRISING A VARIABLE SPEED DRIVE AND A CIRCUIT BREAKER

(75) Inventors: Jerome Barreau, Courdimanche (FR); Frederic Leon, Marcilly sur Eure (FR)

(73) Assignee: Schneider Toshiba Inverter Europe SAS, Pacy sur Eure (FR)

( * ) Notice: Subject to any disclaimer, the term of this patent is extended or adjusted under 35 U.S.C. 154(b) by 393 days.

(21) Appl. No.: 13/147,376

(22) PCT Filed: Mar. 5, 2010

(86) PCT No.: PCT/EP2010/052794
§ 371 (c)(1),
(2), (4) Date: Aug. 2, 2011

(87) PCT Pub. No.: WO2010/105920
PCT Pub. Date: Sep. 23, 2010

(65) Prior Publication Data
US 2012/0019987 A1    Jan. 26, 2012

(30) Foreign Application Priority Data
Mar. 18, 2009    (FR) ...................................... 09 51718

(51) Int. Cl.
*H02B 1/04*    (2006.01)
(52) U.S. Cl.
USPC .......................................... 361/673; 248/674
(58) Field of Classification Search
USPC ................................................ 361/600–678
See application file for complete search history.

(56) References Cited

U.S. PATENT DOCUMENTS

| | | | |
|---|---|---|---|
| 4,769,557 A | 9/1988 | Houf et al. | |
| 4,991,061 A * | 2/1991 | Strange | 361/811 |
| 5,555,159 A * | 9/1996 | Dore | 361/796 |
| 7,012,800 B2 * | 3/2006 | Busch et al. | 361/605 |
| 7,021,599 B2 * | 4/2006 | DeGrazia et al. | 248/645 |
| 7,800,339 B2 * | 9/2010 | Gonzalez et al. | 318/807 |
| 2005/0180814 A1 | 8/2005 | Lehner et al. | |
| 2005/0189889 A1 * | 9/2005 | Wirtz et al. | 318/105 |
| 2009/0091877 A1 | 4/2009 | Pispa | |

FOREIGN PATENT DOCUMENTS

| | | |
|---|---|---|
| EP | 0 659 040 | 6/1995 |
| EP | 0 660 652 | 6/1995 |
| EP | 2 048 926 | 4/2009 |

OTHER PUBLICATIONS

International Search Report issued Apr. 6, 2010 in PCT/EP10/052794 filed Mar. 5, 2010.

* cited by examiner

*Primary Examiner* — Zachary M Pape
(74) *Attorney, Agent, or Firm* — Oblon, Spivak, McClelland, Maier & Neustadt, L.L.P.

(57) ABSTRACT

A control assembly including: a variable-speed drive for controlling an electric charge, the variable speed drive including a rear attachment mechanism for attaching same to a mounting and a power terminal board receiving a power via power lines; and an electrical interrupter connected to the power lines to control or protect the variable-speed drive. The electrical interrupter is electrically connected to the power terminal board of the variable-speed drive, and the control assembly includes attachment means for mechanically attaching the electrical interrupter to the variable-speed drive only.

8 Claims, 3 Drawing Sheets

CONTROL ASSEMBLY COMPRISING A VARIABLE SPEED DRIVE AND A CIRCUIT BREAKER

The present invention relates to a control assembly comprising a variable speed drive and an electric switching device such as an electromechanical contactor or a protection circuit breaker.

It is known to produce a control assembly comprising a variable speed drive intended to control an electric load and an electric switching device such as, for example, a protection circuit breaker. In this assembly, the variable speed drive notably includes a power terminal block receiving power current via current lines and the circuit breaker is connected to the current lines to protect the variable speed drive in case of overload or short circuit.

As a general rule, the variable speed drive is fixed to a support using fixing means and the circuit breaker is also fixed to the same support, by being, for example, attached to a DIN rail. In this situation, the circuit breaker must be fixed to the support at a certain distance, above or below the variable speed drive, which makes the assembly particularly bulky. Furthermore, since the depth of the variable speed drive is much greater than that of the circuit breaker and the two appliances are fixed to the same support, the unit for operating the circuit breaker is difficult to access, at the bottom of the enclosure for example.

The document U.S. Pat. No. 4,769,557 describes a variable speed drive on which it is possible to fix a protection module. The protection module is specially configured to be attached to the variable speed drive.

The aim of the invention is to propose a control assembly comprising a variable speed drive to which it is possible to fix an electric switching device that can have different sizes or shapes. The control assembly has a particularly small bulk and the electric switching device can be easily operated therein.

This aim is achieved by a control assembly comprising:
- a variable speed drive intended to control an electric load, said variable speed drive including, at the rear, fixing means to be fixed to a support and including a power terminal block receiving power current via current lines,
- an electric switching device connected to the current lines to control or protect the variable speed drive,
- the electric switching device being electrically connected to the power terminal block of the variable speed drive and,
- the control assembly including fixing means for mechanically fixing the electric switching device only to the variable speed drive,
- the fixing means including an intermediate support piece (40) comprising a first part (400) intended to be fixed to the top face (102) of the variable speed drive (10) and a second part (401) to which the electric switching device is fixed.

According to the invention, the electric switching device is an electromechanical contactor or a protection circuit breaker.

According to a particular feature, the circuit breaker is fixed to the front part of the variable speed drive.

According to another particular feature, the widthwise bulk of the variable speed drive is identical to that of the protection circuit breaker.

According to another particular feature, the fixing means comprise a generally L-shaped support piece comprising a first part intended to be fixed to the top face of the variable speed drive and a second part to which the circuit breaker is fixed.

According to another particular feature, the support piece is fixed to the top face of the variable speed drive via screws, the circuit breaker fixed to the support piece masking said screws.

According to another particular feature, the second part of the support piece comprises an attachment unit to which the circuit breaker can be fixed using suitable fixing means.

According to another particular feature, the control assembly includes an electric interconnection piece making it possible to electrically connect the circuit breaker to the power terminal block of the variable speed drive.

Other features and advantages will emerge from the following detailed description referring to an embodiment given as an example and represented by the appended drawings in which.

The invention relates to a control assembly comprising a variable speed drive 10 and an electric switching device such as, for example, an electromechanical contactor or a protection circuit breaker.

Hereinafter in the description, the electric switching device described is a protection circuit breaker 20. It should be understood that the invention can equally be adapted to an electric switching device of electro-mechanical contactor type.

Hereinafter in the description, the expressions "front part" and "rear part" should be understood to mean the parts of the variable speed drive delimited by a median vertical cross-sectional plane relative to the depth of the variable speed drive.

As is known, a variable speed drive 10 is intended to control an electric load (not represented) and includes a power terminal block to which power current lines are connected. The power terminal block comprises upstream power terminals (top) 104 and downstream power terminals (bottom—not visible in the figures).

The protection circuit breaker 20 is connected to the power current lines and includes a power terminal block that also has upstream power terminals (top) 204 and downstream power terminals (bottom—not visible in the figures). The power current lines are connected to the upstream power terminals 204 of the circuit breaker.

Figure 1:
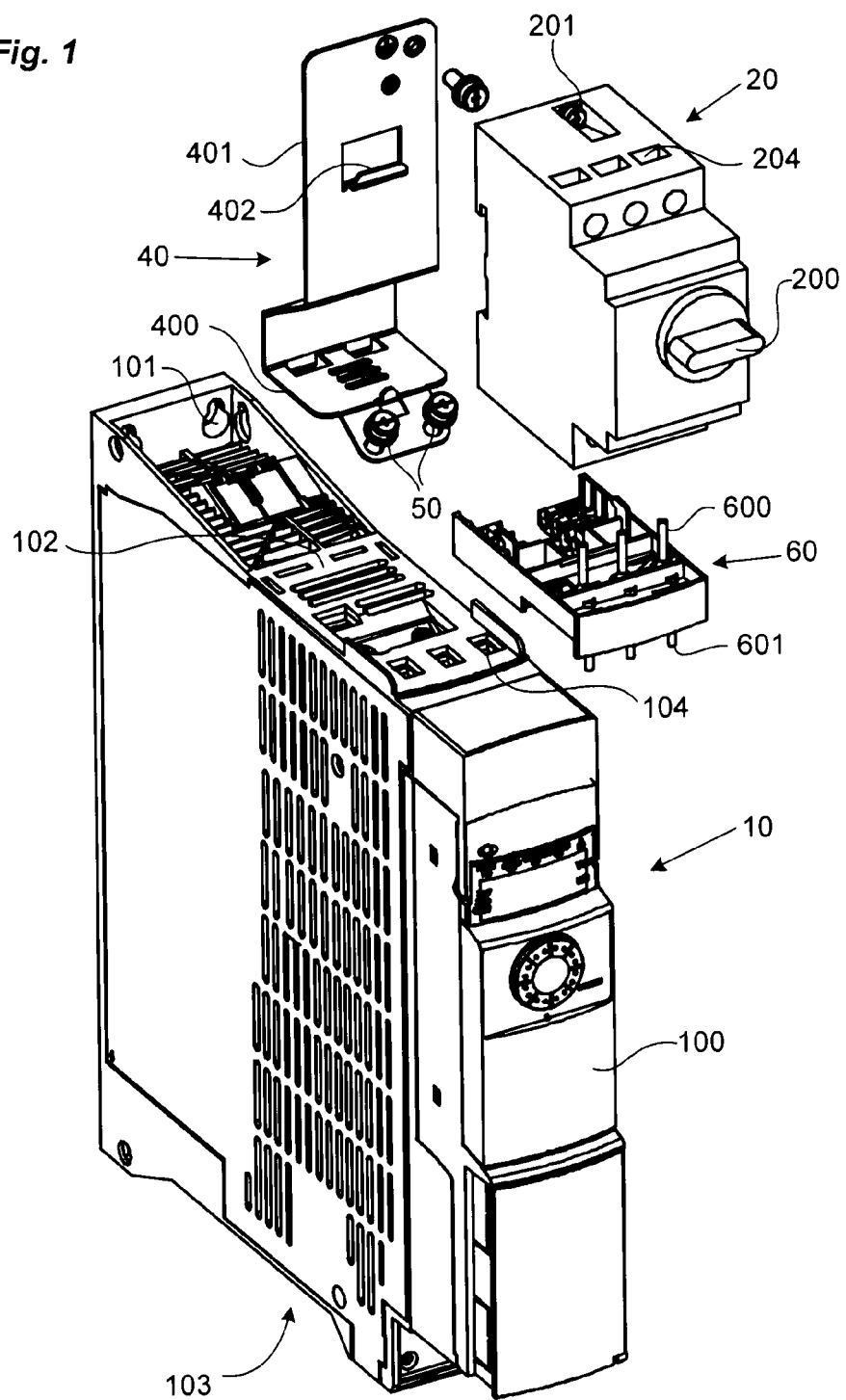
FIG. 1 represents an exploded view of the control assembly of the invention.
Figure 2:
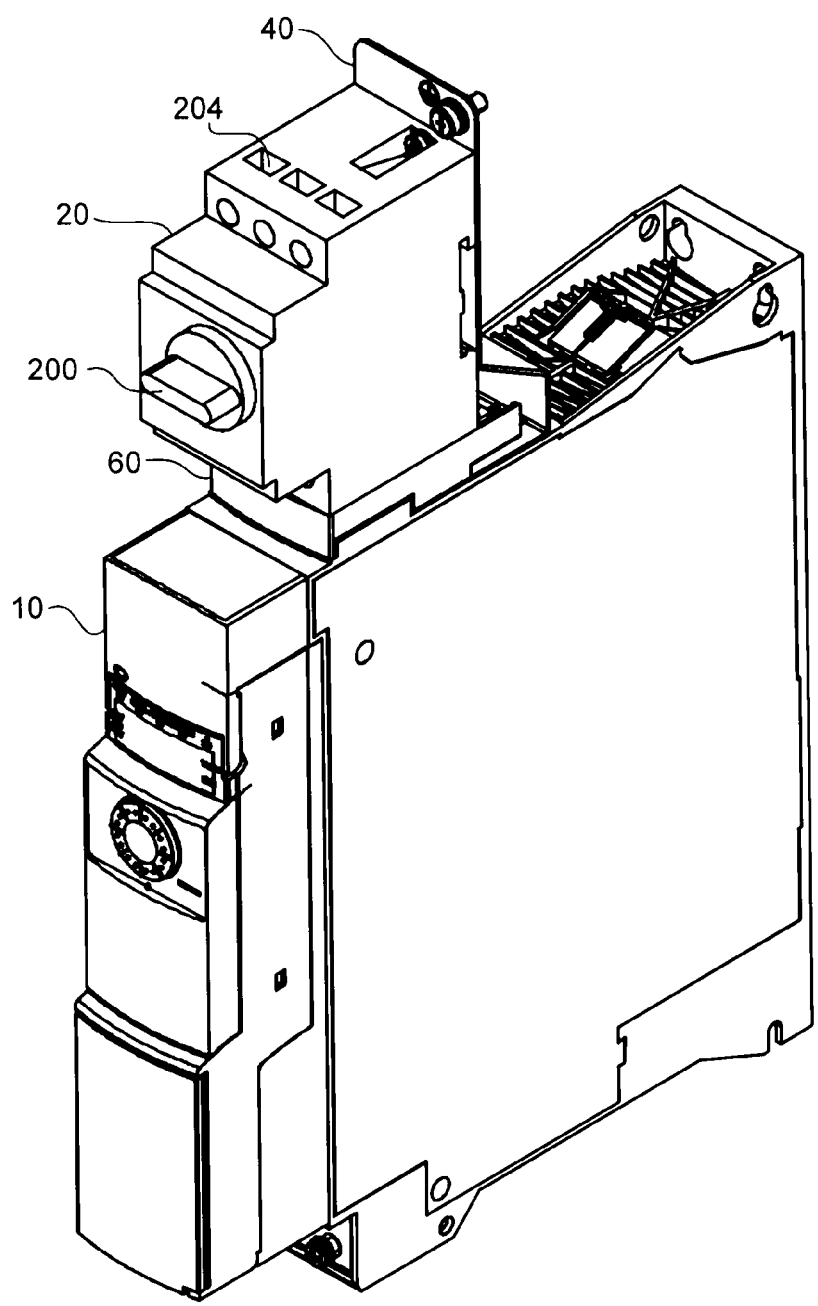
FIG. 2 represents the control assembly of the invention assembled.
Figure 3:
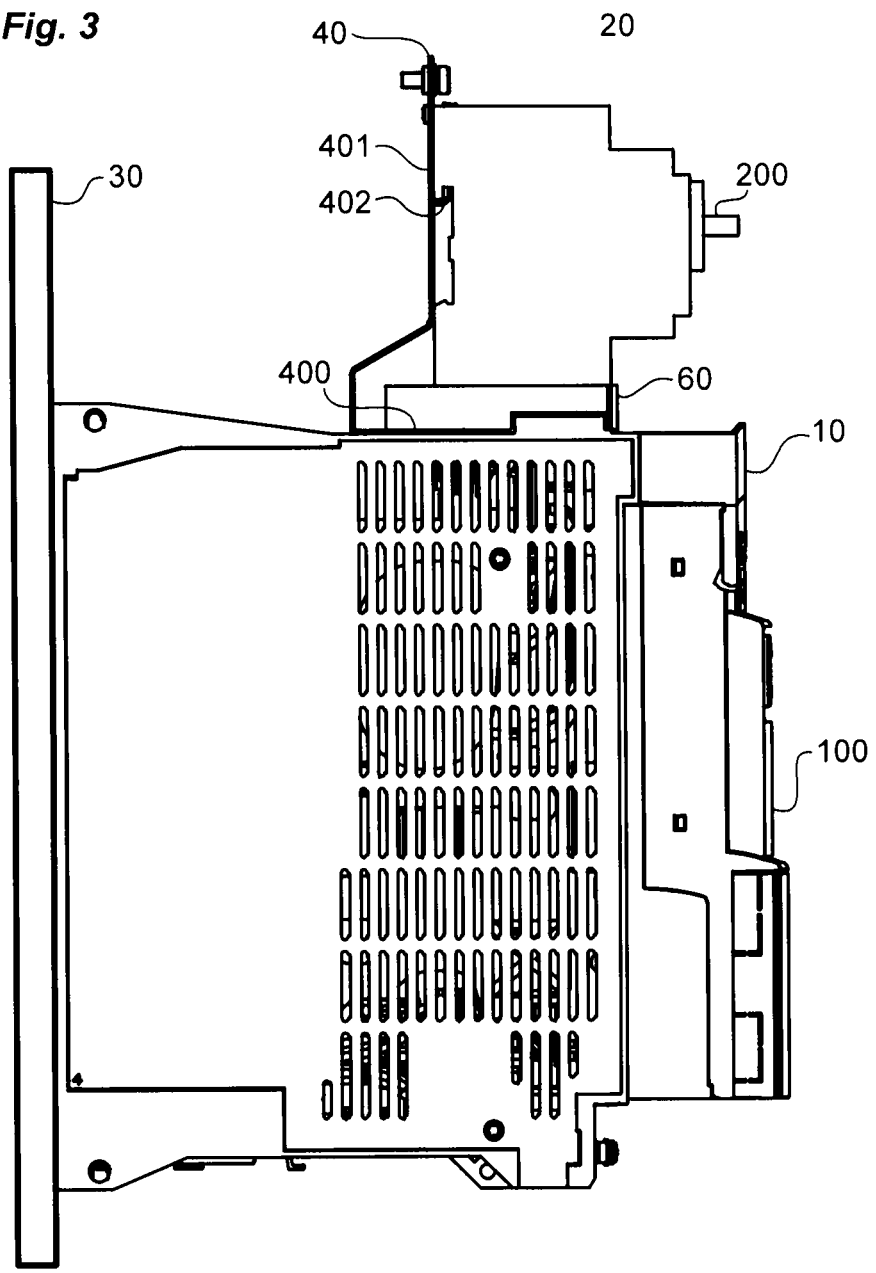
FIG. 3 represents the control assembly of the invention in a side view.

The variable speed drive typically includes a front part and a rear part. The front part comprises a control front panel 100 and the rear part comprises fixing means 101 making it possible to fix the variable speed drive via the rear to a support 30 (FIG. 3). The variable speed drive 10 also includes a top face 102 on which the upstream power terminals 104 are implemented and a bottom face 103 on which the downstream power terminals are implemented. The power terminals are implemented on the front part of the variable speed drive 10.

According to the invention, the circuit breaker 20 is not fixed to a support such as the support 30 receiving the variable speed drive 10 but is fixed directly to the variable speed drive 10 and only to the variable speed drive 10. For this, the control assembly includes fixing means enabling the circuit breaker 20 to be fixed to the variable speed drive 10. These fixing means comprise a metal support piece 40 that is generally L-shaped defining a first part 400 intended to be fixed to the top face 102 of the variable speed drive and a second part 401 substantially perpendicular to the first part and to which the circuit breaker 20 is fixed via the rear by virtue of suitable fixing means. The use of an intermediate fixing piece between the variable speed drive 10 and the circuit breaker 20 makes it possible to attach circuit breakers of different sizes and therefore of different ratings without implementing specific attachment means on the variable speed drive 10. On the top face 102 of the variable speed drive 10, on its front face, the support piece 40 is for example fixed by virtue of two screws 50 passing through an inclined part extending its first part 400. The screws 50 are, for example, accommodated in a recess formed on the top face 102 of the variable speed drive 10. One or more lugs may be provided on the support piece to ensure its positioning and its attachment to complementary shapes formed on the top face 102 of the variable speed drive. When the circuit breaker 20 is fixed to the support piece 40, the latter masks the screws 50 fixing the support piece to the top face 102 of the variable speed drive 10. Thus, it is impossible to remove the support piece 40 when the circuit breaker 20 is still mounted on the support piece 40. The second part 401 of the support piece 40 includes an attachment unit 402 intended to receive the suitable fixing means of the circuit breaker 20. The fixing means of the circuit breaker 20 are those usually used by the circuit breaker 20 for attachment to a DIN rail. Furthermore, the circuit breaker 20 may also be fixed to the second part 401 of the support piece 40 using a screw 201.

According to the invention, since the circuit breaker is fixed to the front part of the variable speed drive 10, its operating unit 200 is very easy to access and sufficiently advanced to be substantially at the same level as the control front panel 100 of the variable speed drive 10.

Furthermore, the control assembly includes an inter-connection piece 60 intended to be positioned partly between the first part 400 of the support piece 40 and the circuit breaker 20 and extending beyond the first part 400 of the support piece 40 in order to be able to ensure the electrical interconnection between the circuit breaker 20 and the variable speed drive 10 without using wires. This interconnection piece 60 includes top pins 600 intended to be engaged in the downstream power terminals of the circuit breaker 20 and bottom pins 601 intended to be engaged in the upstream power terminals 104 of the variable speed drive 10. The pins of the interconnection piece are fixed but may equally be adjustable to adapt to variable inter-terminal pitches of the two appliances. The interconnection piece 60 may also include fixing means enabling it to receive and fix the circuit breaker 20.

According to the invention, the variable speed drive 10 has the advantage of having a widthwise bulk that is identical or at least almost identical (to within +/−0.5 mm) to that of the circuit breaker 20. This is made possible by virtue of a particular internal arrangement of the variable speed drive 10. Similarly, the support piece 40 has approximately the same widthwise bulk as the circuit breaker 20 and the variable speed drive 10. In this way, the control assembly of the invention is particularly compact.

The invention claimed is:

1. A control assembly comprising:
 a variable speed drive configured to control an electric load, the variable speed drive including, at a rear, fixing means to be fixed to a support and including a power terminal block receiving power current via current lines;
 an electric switching device connected to the current lines to control or protect the variable speed drive;
 fixing means for mechanically fixing the electric switching device only to the variable speed drive;
 wherein the electric switching device is electrically connected to the power terminal block of the variable speed drive, and
 wherein the fixing means for mechanically fixing includes an intermediate support piece comprising a first part configured to be fixed to a top face of the variable speed drive and a second part to which the electric switching device is fixed.

2. The control assembly as claimed in claim 1, wherein the electric switching device is an electromechanical contactor or a protection circuit breaker.

3. The control assembly as claimed in claim 2, wherein the circuit breaker is fixed to a front part of the variable speed drive.

4. The control assembly as claimed in claim 2, wherein a widthwise bulk of the variable speed drive is identical to that of the protection circuit breaker.

5. The control assembly as claimed in claim 2, wherein the support piece has a general L-shape defined by its first part configured to be fixed to the top face of the variable speed drive and its second part to which the circuit breaker is fixed.

6. The control assembly as claimed in claim 5, wherein the second part of the support piece comprises an attachment unit to which the circuit breaker can be fixed using suitable fixing means.

7. The control assembly as claimed in claim 5, wherein the support piece is fixed to the top face of the variable speed drive via screws, and the circuit breaker fixed to the support piece masks the screws.

8. The control assembly as claimed in claim 2, further comprising an electric interconnection piece making it possible to electrically connect the circuit breaker to the power terminal block of the variable speed drive.

* * * * *